United States Patent [19]

Hamilton et al.

[11] Patent Number: 4,838,452

[45] Date of Patent: Jun. 13, 1989

[54] SHUTTER SYSTEM FOR ELECTRICAL COMPONENT SUPPLY TAPE FEEDER

[75] Inventors: Daniel A. Hamilton, Garland, Tex.; James R. Spowart, Canoga Park, Calif.; Richard Porterfield, Binghamton, N.Y.

[73] Assignee: Universal Instruments Corporation, Binghamton, N.Y.

[21] Appl. No.: 127,991

[22] Filed: Nov. 27, 1987

[51] Int. Cl.⁴ .......................... B65H 5/28; B65H 5/08
[52] U.S. Cl. .......................................... 221/1; 221/25; 221/74; 221/211
[58] Field of Search ............... 221/1, 25, 71, 72, 74, 221/79, 197, 210, 211, 220, 247, 248; 29/759, 825, 829, 842

[56] References Cited

U.S. PATENT DOCUMENTS

| | | | |
|---|---|---|---|
| 3,618,192 | 11/1971 | Hoffken | 221/220 |
| 4,494,902 | 1/1985 | Kuppens et al. | 221/25 X |
| 4,606,117 | 8/1986 | Takahashi et al. | 29/759 X |
| 4,620,655 | 11/1986 | Fujita | 221/186 X |
| 4,735,341 | 4/1988 | Hamilton et al. | 221/197 X |
| 4,740,136 | 4/1988 | Asai et al. | 221/74 X |

FOREIGN PATENT DOCUMENTS 60-24100 2/1985 Japan.
61-64199 4/1986 Japan.

Primary Examiner—F. J. Bartuska
Attorney, Agent, or Firm—Fidelman & Wolffe

[57] ABSTRACT

A component supply tape is stepped to present each pocket at a component pick-up area, and a top cover of the tape is peeled back so that each pocket is opened in turn. A shutter is positioned over the pick-up area prior to tape movement so that the pocket is covered by the shutter as the top cover is peeled from the substrate. After each indexing step, the shutter is actuated to uncover the opened pocket which is situated at the pick-up area for retrieval by the vacuum nozzle of a pick-and-place head. By the improved method and apparatus of the instant invention, the pick and place head is provided with a finger for opening the shutter of the feeder while the vacuum nozzle is advanced along a normal to the pick-up surface of the component, so as to minimize the period of time that the component is uncovered.

14 Claims, 3 Drawing Sheets

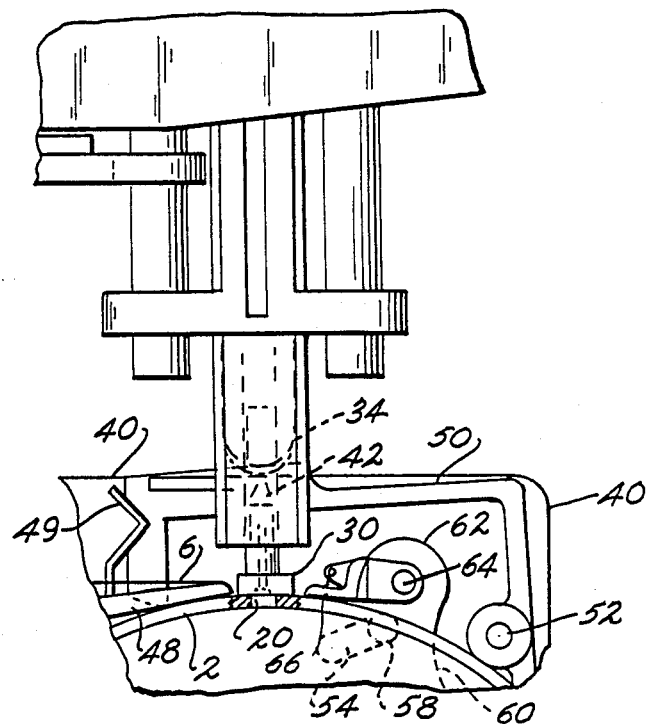
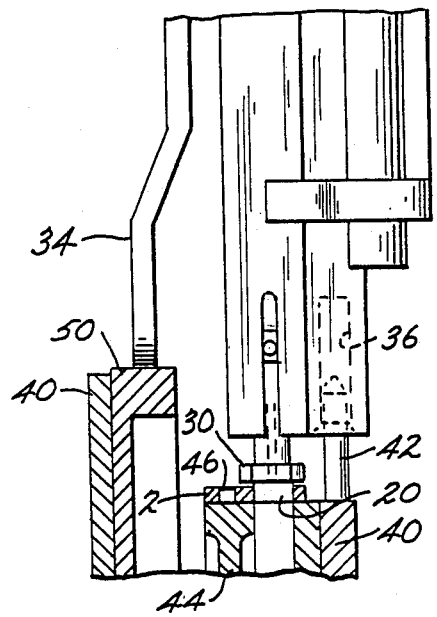
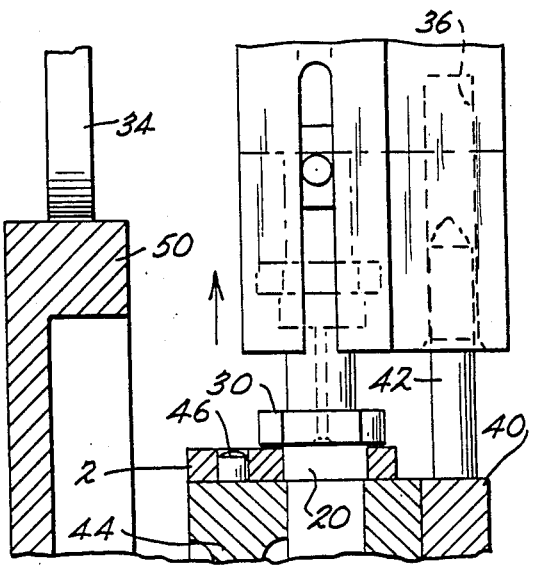

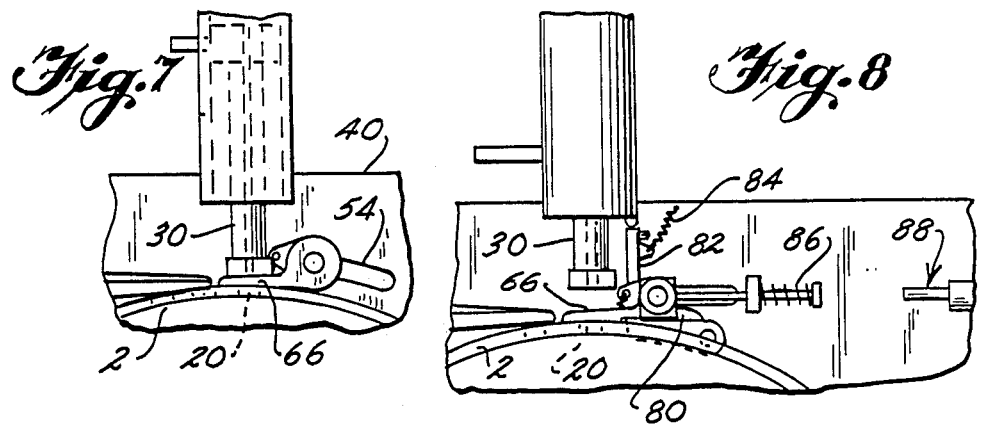
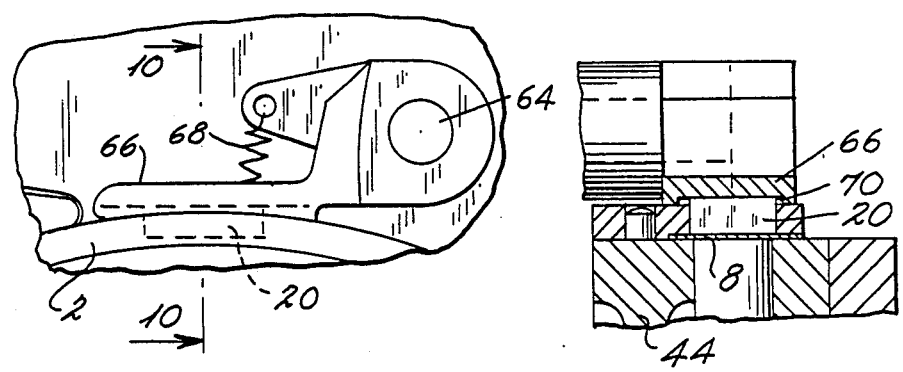
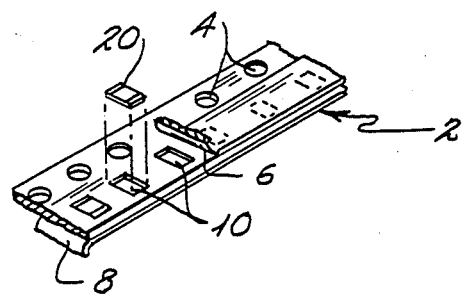

SHUTTER SYSTEM FOR ELECTRICAL COMPONENT SUPPLY TAPE FEEDER

PRIOR ART CROSS REFERENCES

U.S. application Ser. No. 861,977, Hamilton, et al, IMPROVED FEEDER FOR ELECTRICAL COMPONENT SUPPLY TAPES, filed May 12, 1986 now U.S. Pat. No. 4,735,341.

U.S. Pat. No. 4,492,902, Kuppens, et al, METHOD OF AND DEVICE FOR FEEDING ELECTRIC AND/OR ELECTRONIC ELEMENTS TO GIVEN POSITIONS, issued Jan. 22, 1985.

U.S. Pat. No. 4,620,655, Fujita, APPARATUS FOR SUPPLYING TAPED PARTS, issued Nov. 4, 1986.

U.S. Pat. No. 4,606,117, Takahashi, et al, APPARATUS FOR AUTOMATICALLY MOUNTING CHIP TYPE CIRCUIT ELEMENTS ON PRINTED CIRCUIT BOARDS, issued Aug. 19, 1986.

Japanese Patent Disclosure No. 61-64199, laid open Apr. 2, 1986.

Japanese Patent Disclosure No. 60-24100, laid open Feb. 6, 1985.

BACKGROUND AND SUMMARY OF THE INVENTION

The invention is in the field of tape feeders, particularly feeders for stepwise indexing of tapes having pockets containing surface mountable electrical components.

The tape is advanced stepwise to sequentially present each pocket to a pick-up station where the component is removed from the pocket for subsequent handling such as transfer to a conveyor or direct placement onto a circuit board. Typically, a top cover of the tape is peeled or split to provide access to the component and auxiliary covers or movable "shutters" are provided to prevent loss of components from open pockets.

Several type of supply tapes are presently used. One type has a plastic substrate embossed to define component holding the pockets which are enclosed by a separable thin plastic top cover; and the other type has holes all the way through a cardboard substrate with top and bottom covers for the holes so as to define the component pockets.

Heretofore various attempts have been made to prevent loss of the component from the pocket after removal of the top cover, and the above cross referenced U.S. application Ser. No. 861,977 illustrates an auxiliary cover or shutter for covering the component in the pocket after the top cover of the substrate has been peeled back. The shutter is movable away from the pocket by the feeder mechanism through movement of a shutter supporting link when the feeder is actuated and, thereafter, a vacuum nozzle is advanced into engagement with the top surface of the component for removal from the pocket.

Some component packaging specifications allow for a slight protrusion of the top surface of the component above a top plane of the pocket. Although a shutter may cover the component simultaneously with removal of the top cover of the substrate from the pocket, the case sometimes arises that the bottom surface of the shutter is in engagement with the component in the pocket. Thus, uncovering of the pocket by lateral sliding of the shutter can result in a "tiddlywink" effect wherein the component pops up and is not properly engaged by the vacuum nozzle of the pick and place head. Additionally, flexibility of the auxiliary or integral bottom of the pocket allows it to deform, during packaging of a component having a height greater than the depth of the substrate pocket, so that energy stored in the deformed bottom and the pocket can propel the component out of the pocket when the shutter is opened. Static electricity and vibration are effects which also can contribute to the criticality of the component being engaged by the vacuum nozzle as quickly as possible upon uncovering of the opened pocket.

The above cross-referenced Japanese Patent Disclosures are illustrative of shutters interlinked for actuation with indexing of a tape feeder. Sliding movement is imparted to these shutters to cover and uncover a pick-up station and provide access for pick-up a component from an open pocket.

U.S. Pat. Nos. 4,494,902 and 4,620,655, cross-referenced above, teach relative sliding movement between a plate and a pick-up station in order to allow removal of a component through an opening in the plate in timed relationship with actuation of the feeder. U.S. Pat. No. 4,606,117 discloses engaging and opening of a shutter by a protruding portion of a pick and place head during lateral movement of the head between pick-up and placement stations, as illustrated in FIGS. 18 and 20 thereof.

None of the cross-referenced prior art suggest or teach opening of a shutter by the pick and place head while it is advancing the vacuum nozzle into engagement with a top surface of the component so as to minimize the period of time during which the component is uncovered before engagement by the vacuum nozzle. In contradistinction, the instant invention is particularly directed to such a method of actuating the shutter and the apparatus for accomplishing such method.

Accordingly, it is an objective of this invention to provide a method and apparatus for preventing loss of components from opened pockets prior to their removal by the vacuum tube of a pick and place head or the like.

Details of the manner of accomplishing the objectives of the invention will become apparent from the disclosure that follows.

SUMMARY OF THE INVENTION

A component supply tape is stepped to present each pocket at a component pick-up area, and the top cover of the tape is peeled back so that each pocket is opened in turn. A shutter is positioned over the pick-up area prior to tape movement so that the pocket is covered by the shutter as the top cover is peeled from the substrate. After each indexing step, the shutter is actuated to uncover the opened pocket which is situated at the pick-up area for retrieval by the vacuum nozzle of a pick-and-place head. By the improved method and apparatus of the instant invention, the pick and place head is provided with a finger for opening the shutter of the feeder while the vacuum nozzle is advanced along a normal to the pick-up surface of the component, so as to minimize the period of time that the component is uncovered.

The drawings illustrate only those portions of the feeder and the pick and place head which are necessary for an understanding of the invention and the reader's attention is directed to the above cross-referenced prior art for a more complete understanding of feeder mechanisms, with particular attention directed to pending application Ser. No. 861,977 for a better understanding of the shutter link and its interaction with other links of the feeder mechanism.

BRIEF DESCRIPTION OF THE DRAWINGS

FIGS. 4 and 5 are views similar to FIGS. 1 and 2, but showing the vacuum nozzle in engagement with the component in preparation for removal thereof from the pocket of the supply tape.

FIG. 6 is an enlargement of FIG. 5.

FIG. 7 is a partial front elevational view illustrating the embodiment wherein the nozzle engages the top surface of the shutter just prior to opening of the shutter.

FIG. 8 is a partial front elevational view of an alternate embodiment for moving the shutter to uncover the component.

FIG. 9 is a front elevation illustrating an alternate embodiment of the shutter.

FIG. 10 is a cross section as generally viewed in the directions of arrows 10—10 of FIG. 9.

FIG. 11 is a partial isometric view of a supply tape and a surface mountable component.

DETAILED DESCRIPTION OF THE INVENTION

Figure 1:
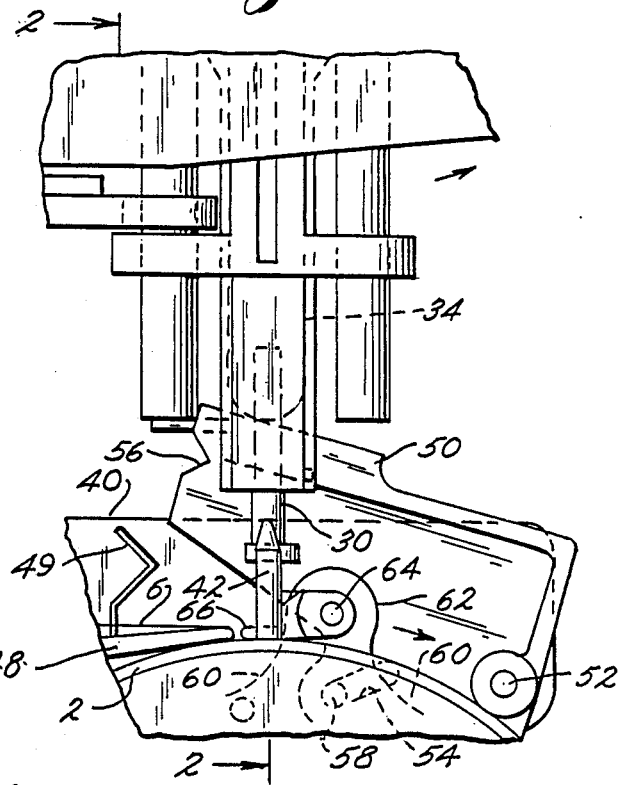
FIG. 1 is a partial front elevational view of a first embodiment of the invention.

Surface mountable components 20 are available in supply tapes 2 for supplying surface mountable components 20 to a pick and place head or the like by means of an indexing feeder mechanism. Typically, the supply tape 2 comprises a cardboard or plastic substrate having pockets or holes 10 therein for reception of the components, a top cover 6, and a bottom cover 8 (when necessary). Indexing holes 4 allow stepped advancing of the tape by a feeder mechanism.

Figure 2:
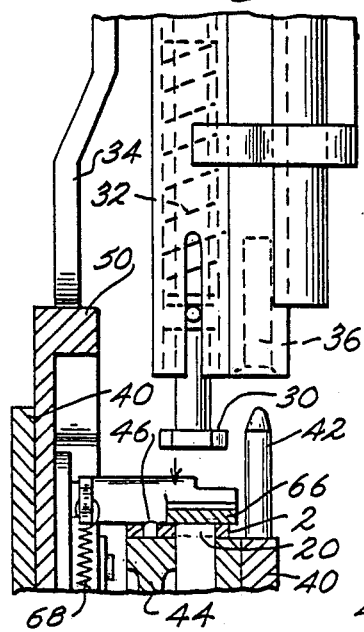
FIG. 2 is a cross section of the device of FIG. 1, as viewed generally in the direction of arrows 2—2 of FIG. 1.
Figure 3:
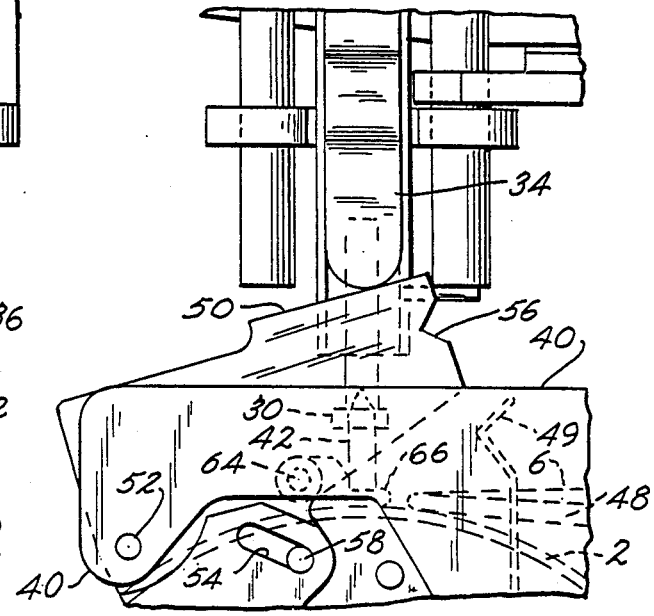
FIG. 3 is a rear elevational view of FIG. 1.

Referring to FIGS. 1-3, a pick and place head has been positioned at a pick-up station for lowering thereof to pick-up the component 20 by vacuum nozzle 30.

The pick and place head has a shutter actuating finger 34 attached thereto in any well known manner in order to engage shutter actuating lever 50 so as to laterally displace shutter 66 and provide access to component 20 in an opened pocket 10 of the supply tape 2. Thus, during downward movement of actuator finger 34 in concert with vacuum nozzle 30, lever 50 is engaged by finger 34 so as to pivot lever 50 about a pivot pin 52 which is attached to the housing 40 of the feeder.

Shutter link 60 is somewhat similar to the shutter link of Applicants' copending application Ser. No. 861,977, with the shutter support 70 of the earlier application being replaced by shutter support ear 62 in the apparatus of the instant invention. Another distinction over the previous application is that shutter link 60, and thus shutter 66, is moved by lever 50 upon engagement thereof by actuator finger 34. Referring to FIGS. 1 and 3, it may be seen that actuator 50 is pivotally attached at 52 to feeder housing 40 and further is provided with a camming slot 54 for receiving pin 58 of shutter link 60. Thus, when actuator 50 is depressed by finger 34, pin 58 follows slot 54 of actuator 50 so as to arcuately displace ear 62 (clockwise as viewed in FIG. 1). As also may be discerned from FIG. 1, shutter 66 is pivotally supported at 64 on ear 62 and is biased into engagement with supply tape 2 by means of tension spring 68 (best seen in FIGS. 2 and 9) so that the bottom of shutter 66 rides upon the top surface of tape 2 during retraction of the shutter for pick-up of component 20 by vacuum nozzle 30.

A spring metal detent 49 mates with a notch 56 of lever 50 so as to hold the shutter 66 open. Lever 50 is raised to reposition shutter 66 at the pick-up station just prior to indexing of tape 20 and positioning of the next component at the pick-up station. Such disengagement of lever 50 from detent 49 may be accomplished by any well known mechanism.

As best seen in FIGS. 5 and 6, feeder housing 40 is provided with an alignment post 42, and the pick and place head has a corresponding alignment bore 36 for reception of post 42 during advancing of the pick-up head toward the component. Such mechanical alignment compensates for sloppiness or loose tolerances positioning of the vacuum nozzle at the pick-up station.

As may be appreciated by reference to Applicants' earlier application, the indexing wheel 44 has teeth 46 for engaging the indexing holes 40 of tape 2 for advancement of the tape by the feeder mechanism.

FIG. 7 illustrates an alternate embodiment of the invention wherein vacuum nozzle 30 is brought into engagement with the top surface of shutter 66 prior to opening of the shutter so as to further minimize the period of time during which a component is uncovered at the pick-up station. Still further, the vacuum nozzle 30 can be slightly retracted into the pick and place head against the bias of compression spring 32 (best seen in FIG. 2) so as to more quickly propel vacuum nozzle 30 into engagement with the component 20 upon opening of the shutter 66. It is also contemplated that shutter 66 may be actuated to move it away from the pick-up station just in time so that the advancing vacuum nozzle 30 does not engage shutter 66 or only slidingly engages it.

Referring to FIG. 8, a further embodiment is contemplated wherein shutter 66 is held over the component 20 against the bias of a compression spring 86 by means of a pivotal latch 80. Upon advancing the vacuum nozzle toward the component, latch 80 may be disengaged by the pick and place head engaging extension 82 of latch 80, thus allowing the shutter 66 to be propelled (to the right as viewed in FIG. 8) by the energy stored in spring 86. Latch 80 may be returned to its latching position by a tension spring 84 and shutter 66 may be repositioned over the pick-up station by means of a reset piston and cylinder arrangement 88.

It is also contemplated that the embodiment of FIGS. 7 and 8 may be combined so that the nozzle 30 in FIG. 8 may rest upon the top surface of the shutter 66 wherein spring 86 may "jerk" the shutter out from under vacuum nozzle 30 much in the same manner as the magician jerks the table cloth from underneath the dishes. Thus, the component 20 is uncovered for still a lesser period of time for pick-up by vacuum nozzle 30.

In the embodiment of FIGS. 9 and 10, the shutter 66 is provided with a channel 70 in the bottom thereof so as to minimize "tiddlywinking" or aerodynamic vacuum displacement of component 20 from pocket 10 during retraction of shutter 66 and uncovering of component 20.

As in the earlier application, finger 48 acts as a guide for top cover 60 during unpeeling thereof from the top surface of tape 2.

In a prototype of the invention, vacuum tip 30 was engaged with the top surface of component 20 during advancement of the pick and place head toward component 20 so as to compress spring 32 by approximately 0.090 inches, and thereafter vacuum was applied to nozzle 30 by a timing means.

The following claims are intended to cover all of the generic and specific features of the invention herein described and all statements of the scope of the invention which as a matter of language, might be said to fall therebetween.

Now that the invention has been described,
We claim:

1. In a method of feeding a tape and presenting pockets in a substrate of said tape to a pick-up station for pick-up of components from said pockets by a vacuum nozzle of a pick-up head wherein said tape has a cover enclosing components in said pockets, said method comprising the steps of: removing said cover from said pockets sequentially in order to provide access to said components at said pick-up station wherein said feeding is a step-wise indexing; and providing a shutter for substantially covering at least one of said pockets and retaining a component therein in preparation for retrieval of said component from said pocket by said vacuum nozzle at said pick-up station, the improvement comprising the steps of:

providing a shutter actuator finger on said pick-up head and a shutter actuating pivotal lever operatively associated with said shutter; and engaging said finger with said lever in order to effect moving of said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval.

2. The improvement as in claim 1, and further comprising the step of:

moving said shutter from said pocket just in time to clear said nozzle during said advancing thereof.

3. The improvement as in claim 1, and further comprising the step of:

engaging said shutter by said nozzle during said advancing in order to further minimize said amount of time during which said component is uncovered for said retrieval.

4. In a method of feeding a tape and presenting pockets in a substrate of said tape to a pick-up station for pick-up of components from said pockets by a vacuum nozzle of a pick-up head wherein said tape has a cover enclosing components in said pockets, said method comprising the steps of: removing said cover from said pockets sequentially in order to provide access to said components at said pick-up station wherein said feeding is a step-wise indexing; providing a shutter for retaining a component in a corresponding pocket during said feeding of said tape and upon removing of the cover from said pocket; removing said cover from each pocket during a last step of said indexing which presents said pocket at said pick-up station; cyclically positioning said shutter at said pick-up station prior to each step of said indexing such that each pocket incrementally moves under and is covered by said shutter during a last step of said indexing; and moving said shutter after said indexing in order to open a pocket and provide access to a component therein at said pick-up station, the improvement comprising the steps of:

providing a shutter actuator finger on said pick-up head and a shutter actuating pivotal lever operatively associated with said shutter; and engaging said finger with said lever in order to effect moving of said said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval.

5. In an apparatus for feeding a tape and presenting pockets in a substrate of said tape to a pick-up station for pick-up of components from said pockets by a vacuum nozzle of a pickup head wherein said tape has a cover enclosing components in said pockets, removing said cover from said pockets sequentially in order to provide access to said components at said pick-up station wherein said feeding is a step-wise indexing; and said apparatus having a shutter for substantially covering at least one of said pockets and retaining a component therein in preparation for retrieval of said component from said pocket by said vacuum nozzle at said pick-up station, the improvement comprising:

a shutter actuator finger on said pick-up head and a shutter actuating pivotal lever operatively associated with said shutter; and means for engaging said finger with said lever in order to effect moving of said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval.

6. The improvement as in claim 5, and further comprising:

means for moving said shutter from said pocket just in time to clear said nozzle during said advancing thereof.

7. The improvement as in claim 5, and further comprising:

means for engaging said shutter by said nozzle during said advancing in order to further minimize said amount of time during which said component is uncovered for said retrieval.

8. The improvement as in claim 5, and further comprising:

a channel in a bottom surface of said shutter so as to prevent displacement of the component from the pocket during moving of said shutter away from said pocket.

9. In an apparatus for feeding a tape and presenting pockets in a substrate of said tape to a pick-up station for pick-up of components from said pockets by a vacuum nozzle of a pick-up head wherein said tape has a cover enclosing components in said pockets, removing said cover from said pockets sequentially in order to provide access to said components at said pick-up station wherein said feeding is a step-wise indexing; a shutter for retaining a component in a corresponding pocket during said feeding of said tape and upon removing of the cover from said pocket; means for removing said cover from each pocket during a last step of said indexing which presents said pocket at said pick-up station; means for cyclically positioning said shutter at said pick-up station prior to each step of said indexing such that each pocket incrementally moves under and is covered by said shutter during said last step of said indexing; and means for moving said shutter after said indexing in order to open a pocket and provide access to a component therein at said pick-up station, the improvement comprising:

a shutter actuator finger on said pick-up head and a shutter actuating pivotal lever operatively associated with said shutter; and means for engaging said finger with said lever in order to effect moving of said shutter from said pocket by said actuator, upon positioning said vacuum nozzle at said pick-up station and during advancing of said vacuum nozzle generally along a normal to a surface of said component for pick-up of said component by said surface, in order to allow retrieval of said component form said pocket while minimizing an amount of time during which said component is uncovered for said retrieval.

10. The improvement as in claim 9, and further comprising:

a channel in a bottom surface of said shutter so as to prevent displacement of the component from the pocket durig moving of said shutter away from said pocket.

11. In a method of feeding a tape and presenting pockets in a substrate of said tape to a pick-up station for pick-up of components from said pockets by a vacuum nozzle of a pick-up head wherein said tape has a cover enclosing components in said pockets, said method comprising the steps of: removing said cover from said pockets sequentially in order to provide access to said components at said pick-up station wherein said feeding is a step-wise indexing; and providing a shutter for substantially covering at least one of said pockets and retaining a component therein in preparation for retrieval of said component from said pocket by said vacuum nozzle at said pick-up station, the improvement comprising the steps of:

providing a shutter actuator on said pick-up head;

engaging and moving said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval;

engaging said shutter by said nozzle during said advancing in order to further minimize said amount of time during which said component is uncovered for said retrieval;

providing means for biasing said nozzle to an extended position relative to said head;

advancing said head while said nozzle engages said shutter so as to contact said nozzle relative to said head and store energy in said means for biasing said nozzle; and releasing said stored energy by moving said shutter laterally out of engagement with said nozzle in order to speed said advancing of said nozzle by said biasing means.

12. In a method of feeding a tape and presenting pockets in a substrate of said tape to a pick-up station for pick-up of components from said pockets by a vacuum nozzle of a pick-up head wherein said tape has a cover enclosing components in said pockets, said method comprising the steps of: removing said cover from said pockets sequentially in order to provide access to said components at said pick-up station wherein said feeding is a step-wise indexing; and providing a shutter for substantially covering at least one of said pockets and retaining a component therein in preparation for retrieval of said component from said pocket by said vacuum nozzle at said pick-up station, the improvement comprising the steps of:

providing a shutter actuator on said pick-up head;

providing means for spring biasing said shutter away from said pocket;

positioning said shutter over said pocket against said spring biasing;

engaging and moving said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval; and jerking said shutter away from said pocket by said spring biasing in order to further minimize said time during which said component is uncovered for said retrieval.

13. In an apparatus for feeding a tape and presenting pockets in a substrate of said tape to a pick-up station for pick-up of components from said pockets by a vacuum nozzle of a pickup head wherein said tape has a cover enclosing components in said pockets, removing said cover from said pockets sequentially in order to provide access to said components at said pick-up station wherein said feeding is a step-wise indexing; and said apparatus having a shutter for substantially covering at least one of said pockets and retaining a component therein in preparation for retrieval of said component from said pocket by said vacuum nozzle at said pick-up station, the improvement comprising:

a shutter actuator on said pick-up head;

means for engaging and moving said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval;

means for engaging said shutter by said nozzle during said advancing in order to further minimize said amount of time during which said component is uncovered for said retrieval;

means for biasing said nozzle to an extended position relative to said head, wherein said nozzle engages said shutter so as to contract said nozzle relative to said head and store energy in said means for biasing said nozzle during advancing said head; and means for releasing said stored energy by moving said shutter laterally out of engagement with said nozzle in order to speed said advancing of said nozzle by said biasing means.

14. In an apparatus for feeding a tape and presenting pockets in a substrate of said tape to a pick-up station for pick-up of components from said pockets by a vacuum nozzle of a pickup head wherein said tape has a cover enclosing components in said pockets, removing said cover from said pockets sequentially in order to provide access to said components at said pick-up station wherein said feeding is a step-wise indexing; and said apparatus having a shutter for substantially covering at least one of said pockets and retaining a component therein in preparation for retrieval of said component from said pocket by said vacuum nozzle at said pick-up station, the improvement comprising:

a shutter actuator on said pick-up head;

means for spring biasing said shutter away from said pocket and positioning said shutter over said pocket and latching said shutter against said spring biasing;

means for engaging and moving said shutter from said pocket by said actuator, upon positioning said vacuum nozzle at said pick-up station and during advancing of said vacuum nozzle generally along a normal to a surface of said component for pick-up of said component by said surface, in order to allow retrieval of said component from said pocket while minimizing an amount of time during which said component is uncovered for said retrieval; and means for jerking said shutter away from said pocket by unlatching said spring biasing means in order to further minimize said time during which said component is uncovered for said retrieval.

* * * * *